United States Patent
Chen

(10) Patent No.: US 6,741,473 B2
(45) Date of Patent: May 25, 2004

(54) STRUCTURE INDUSTRIAL COMPUTER

(75) Inventor: Chih-chung Chen, Taipei (TW)

(73) Assignee: Portwell Inc., Taipei (TW)

( * ) Notice: Subject to any disclaimer, the term of this patent is extended or adjusted under 35 U.S.C. 154(b) by 0 days.

(21) Appl. No.: 10/196,360

(22) Filed: Jul. 17, 2002

(65) Prior Publication Data

US 2004/0012929 A1 Jan. 22, 2004

(51) Int. Cl.[7] ................................................ H05K 7/10
(52) U.S. Cl. ........................ 361/727; 361/756; 439/377; 174/35 R
(58) Field of Search ................................ 361/724–727, 361/683–686, 756–759, 737, 729, 785; 439/159, 157, 377–378; 174/35 R, 35 GS

(56) References Cited

U.S. PATENT DOCUMENTS 5,943,219 A * 8/1999 Bellino et al. .............. 361/816
6,466,448 B1 * 10/2002 Baik .......................... 361/752

* cited by examiner

Primary Examiner—Hung Van Duong
(74) Attorney, Agent, or Firm—Troxell Law Office PLLC

(57) ABSTRACT

An improved structure industrial computer consisting of a system case, with the system case having a flexible component fastened along the edge at one side and a frame member also fastened to the flexible component. A transition mount is positioned at one side of the frame member and an electronic junction board is secured onto the transition mount. One or more slots are disposed on the electronic junction board, with the slots capable of accommodating the insertion of a PCB (printed circuit board) and interface cards. The flexible component is turned to revolve the PCB into the system case such that the PCB extends in a parallel orientation. Conversely, it is only necessary to turn the flexible component outward such that the slots on the transition mount face upward, enabling the integrator to easily insert or remove the PCB from the slots for maintenance and replacement.

6 Claims, 5 Drawing Sheets

STRUCTURE INDUSTRIAL COMPUTER

BACKGROUND OF THE INVENTION

1) Field of the Invention

The invention herein relates to computer systems, specifically an improved structure industrial computer in which a flexible component and a transition mount are coordinated such that a printed circuit board or interface cards are easily installed into the system case or removed to perform maintenance and replacement.

2) Description of the Prior Art

Referring to FIG. 1, a conventional industrial computer main system structurally consists of a open configuration system case 100, with the said system case 100 containing back plane 200; the said back plane 200 has a power supply 101 and, furthermore, a plurality of slots 202 are disposed on the said back plane 200. When such structures are utilized, various different function printed circuit boards 300 or interface cards are inserted into the slots 202, thereby providing for the connecting of the printed circuit boards 300 to the back plane 200 via the slots 202. However, since the said printed circuit boards 300 are positioned into the slots 202 and the printed circuit boards 300 have a certain height, such industrial computer systems occupy considerable space following assembly.

Referring to FIG. 2, to reduce the height of the system case 100, some persons have equipped the back plane 200 with vertical slot 202 capability to afford the perpendicular insertion into such a slot 202 on an electronic junction board 300; the said electronic junction board 300 has one or more coupling slots 301 disposed on it, with the openings of the said coupling slots 301 oriented parallel to the back plane 200. As a result, although a printed circuit board 400 is inserted into a coupling slot 301 such that the printed circuit board 400 extends in an arrangement that is parallel with the back plane 200 and the inserted height of the printed circuit board 400 is lower than that of a convention printed circuit board 300 in a slot 202 to thereby reduce the overall height of the system case 100, since its electronic junction board 300 is inserted into the slot 202 and the slot 202 is inserted into the back plane 200, the user must undertake the parallel insertion the printed circuit board 400 into the coupling slot 301 within the limited confines of the systems case 100 and inevitably contact other electronic components inside the system case 100 during the horizontal application of force and, furthermore, excessive installation force often results in injury and other disadvantages during printed circuit board assembly, maintenance, and replacement.

In view of the shortcomings of the conventional structure, the inventor of the invention herein commenced the improvement of the existent drawbacks by searching for rational solutions, which following extensive research and design culminated in the successful development of the improved structure industrial computer of the invention herein

SUMMARY OF THE INVENTION

The primary objective of the invention herein is to provide an improved structure industrial computer consisting of a system case, with the said system case having a flexible component fastened along the edge at one side and a frame member matching the form of the system case also fastened to the said flexible component such that the said frame member is conjoined to the lateral periphery of the system case. A transition mount is positioned at one side of the said frame member and an electronic junction board is secured onto the said transition mount. One or more slots are disposed on the electronic junction board, with the said slots capable of accommodating the insertion of printed circuit boards. During utilization, the flexible component is turned to revolve the printed circuit board into the system case such that the printed circuit board extends in a parallel orientation and does not project out of the system case. During assembly or disassembly, it is only necessary to turn the flexible component outward such that the slots on the transition mount face upward to enable the integrator to easily insert printed circuit boards into the slots on the transition mount or remove the printed circuit boards from the slots for maintenance and replacement.

Another objective of the invention herein is to provide an improved structure industrial computer consisting of a system case, wherein the said flexible component fastens the flame member of matching form onto the said system case. The said frame member has a different ports installed on it that not only allows during utilization the plugging of peripheral equipment into the ports on the frame member, but also protects the transition mount.

To enable the examination committee a further understanding of the said objectives, the technological means utilized, and other functions of the present invention, the brief description of the drawings below are followed by the detailed description of the invention herein.

DETAILED DESCRIPTION OF THE INVENTION

Figure 1:
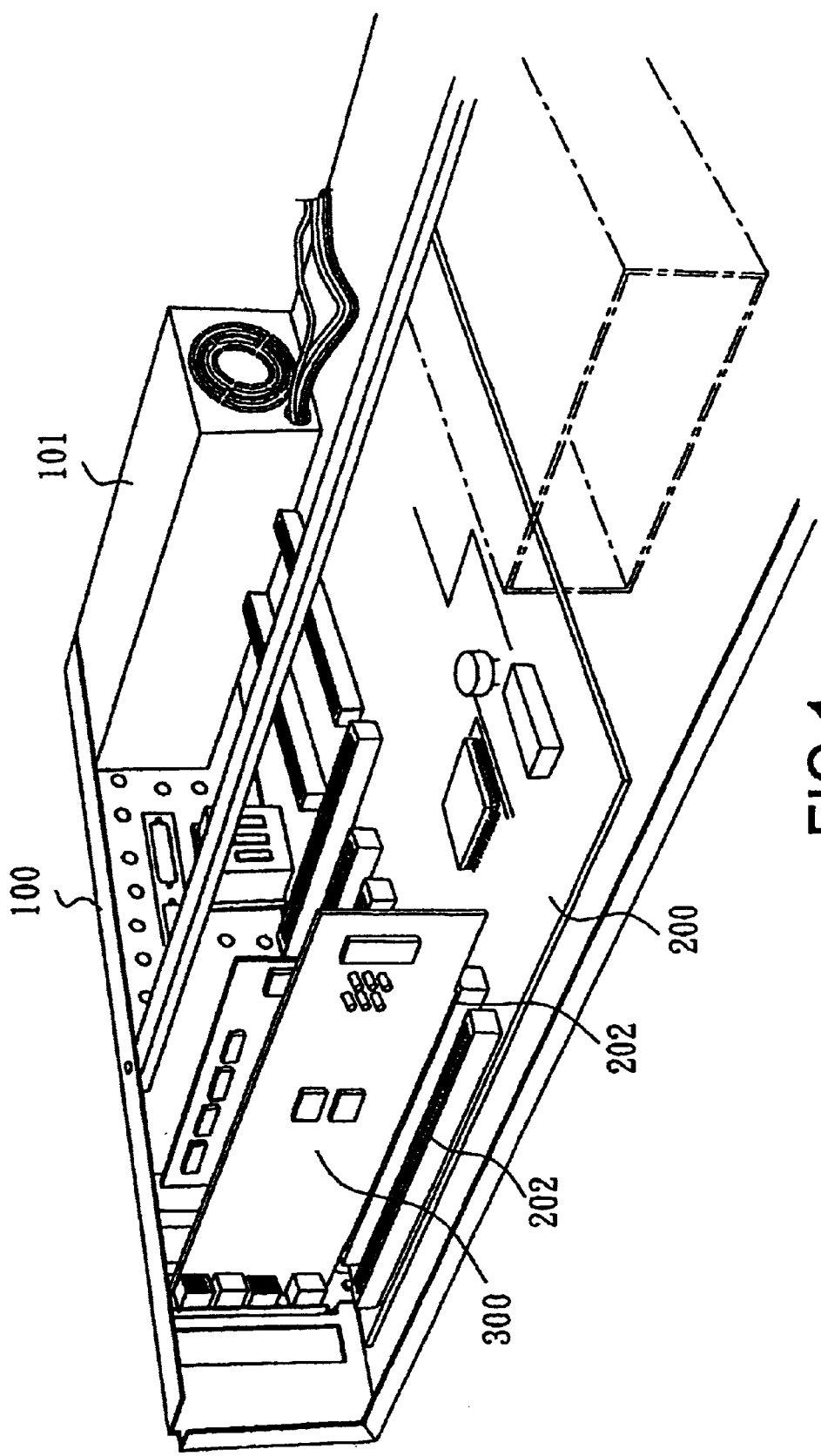
FIG. 1 is an isometric drawing of the conventional technology.
Figure 2:
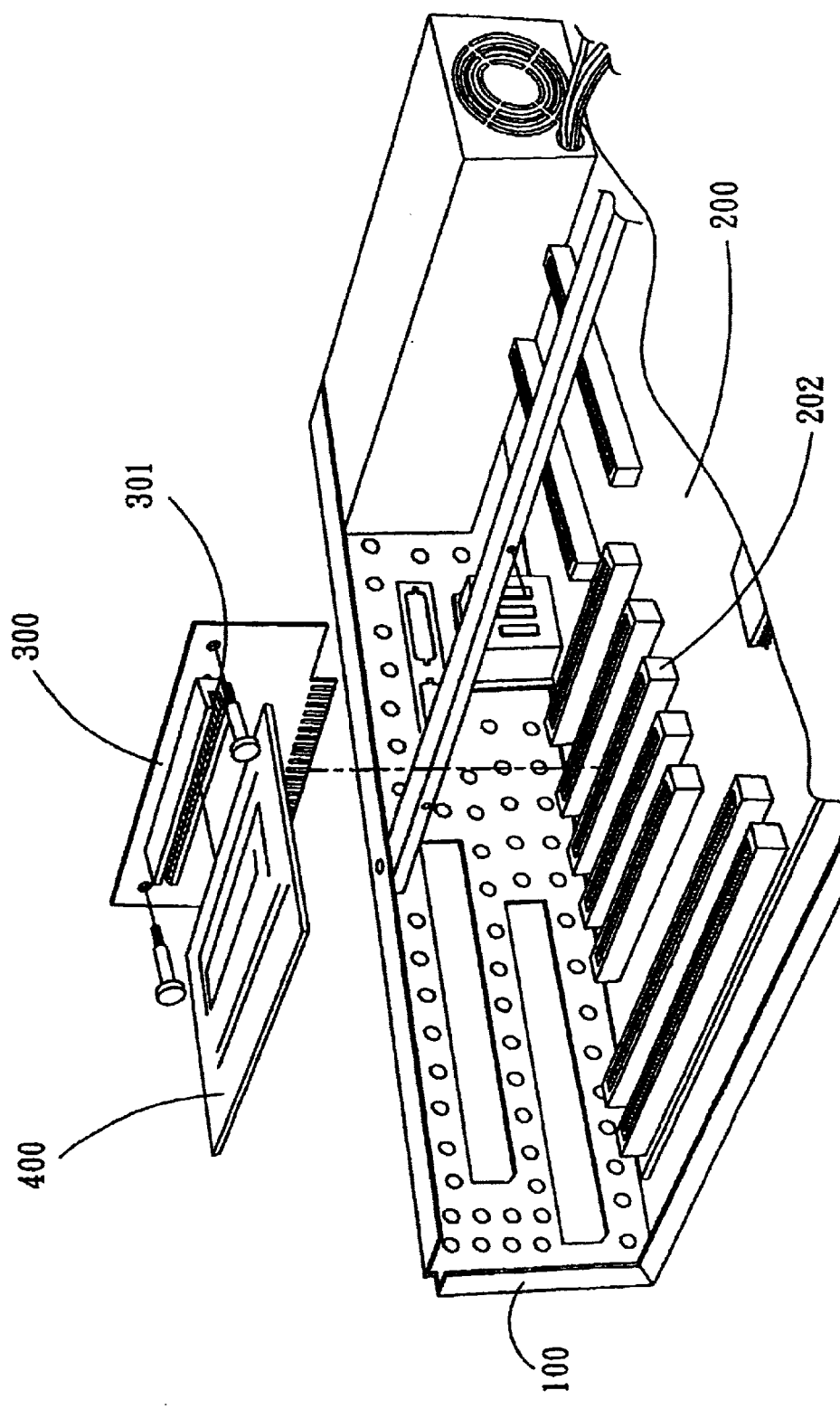
FIG. 2 is another isometric drawing of the conventional technology.
Figure 3:
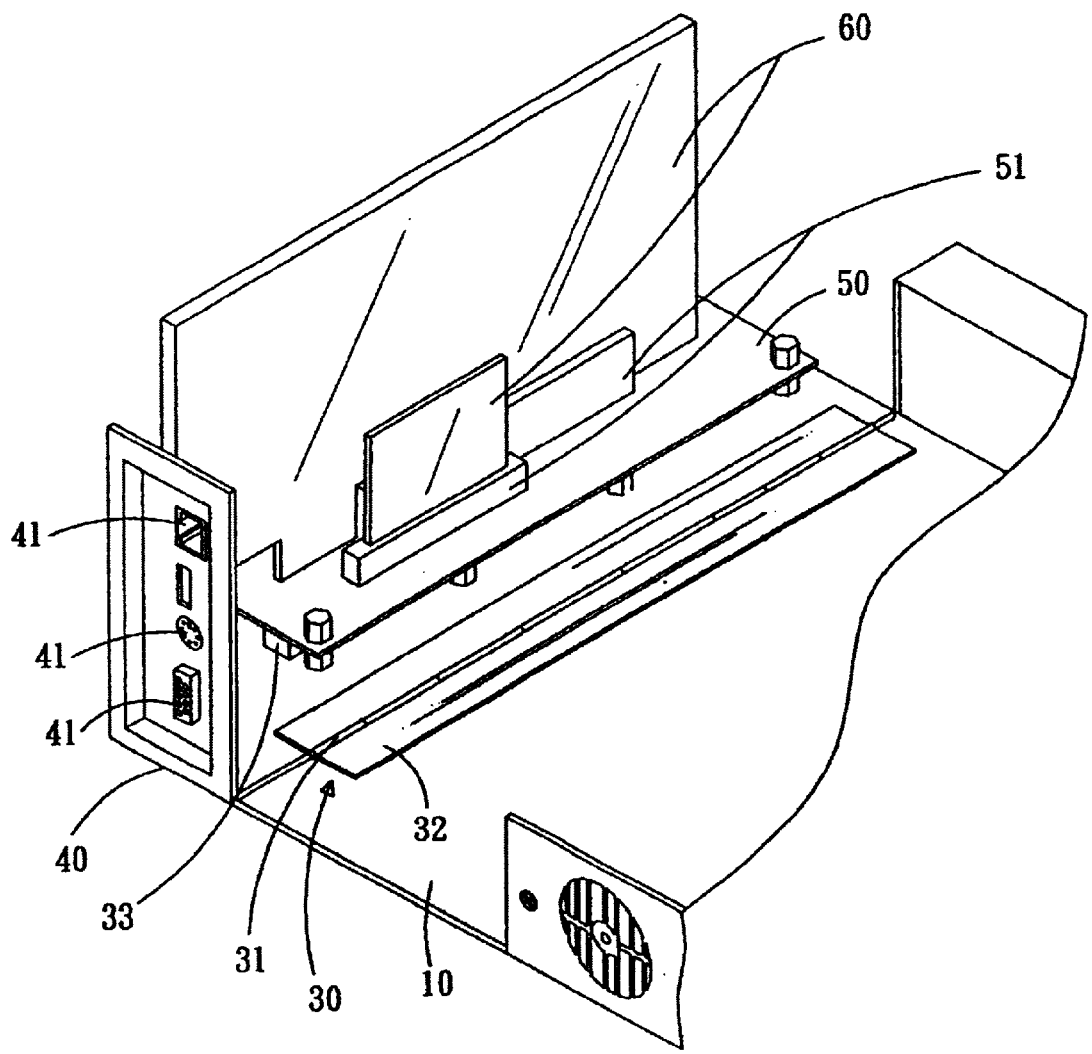
FIG. 3 is an exploded drawing of the invention herein during implementation.
Figure 4:
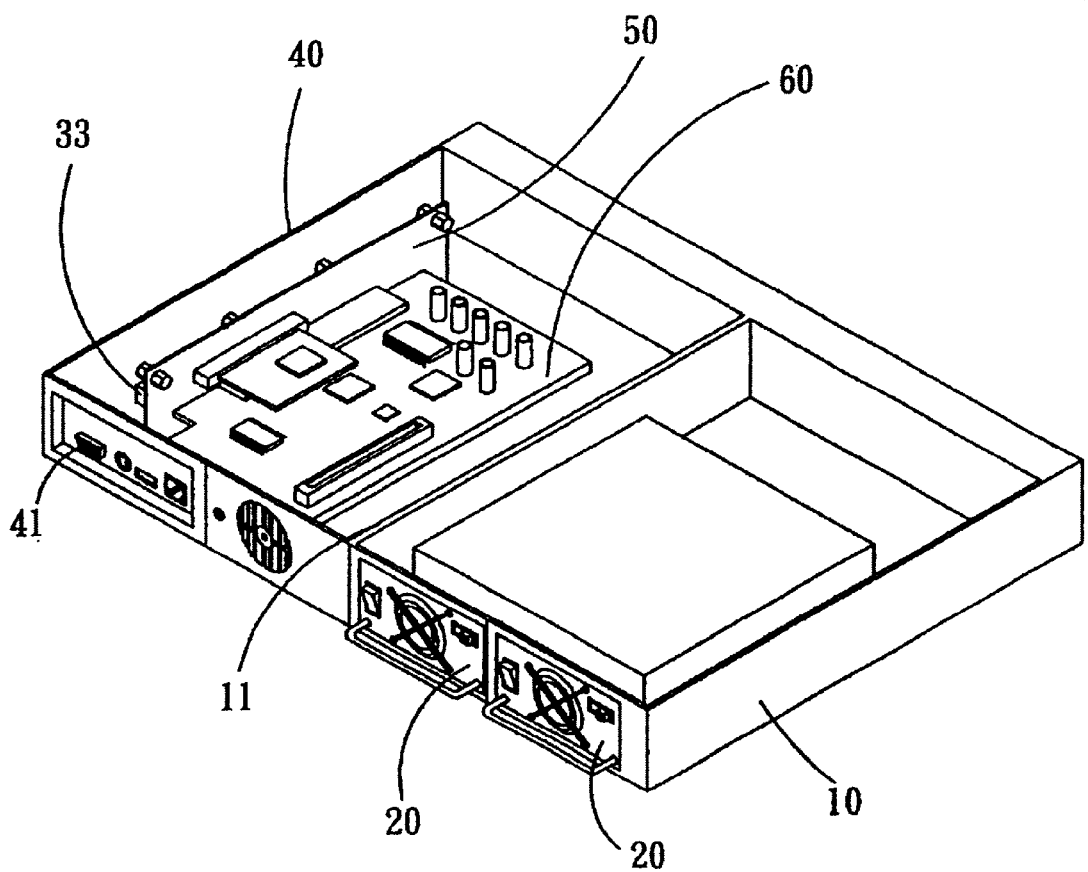
FIG. 4 is an isometric drawing of the invention herein.

Referring to FIG. 3 and FIG. 4, the invention herein is an improved structure industrial computer, the said structure having a system case 10 of an open configuration which in the embodiment herein is 1U (1U=4.445 cm) in height; a separator plate 11 is disposed along the center of the system case 10, with a minimum of one power supply 20 as well as electronic components (as shown in FIG. 4) installed at one side of the said system case 10.

Furthermore, a flexible component 30, in the embodiment herein a hinge (which can be replaced by another component by persons skilled in the technology) is fastened along the edge of the open end at the side opposite from the separator plate 11 of the system case 10; the said flexible component 30 has a pivot pin 31 and the said pivot pin 31 is inserted through interleaved wing elements 32 such that the wing elements 32 are movably linked together by the penetration of the pivot pin 31 and, furthermore, one wing element 32 of the flexible component 30 is fastened to the system case 10 and the other wing element 32 is fastened to a frame member 40 of matching form adjunctive to the system case 10; the said frame member 40 is situated in an a aligned arrangement next to the separator plate 11 and, furthermore, the said frame member 40 is conjoined to the lateral periphery of the system case 10; and different ports 41, such as a PS/2 slot or a USB slot, are installed on one side of the said frame member 40 to facilitate the connection of peripheral equipment to the ports 41 during utilization.

Furthermore, a transition mount 33 securing an electronic junction board 50 is positioned on the surface of the said frame member 40 facing the system case 10, specifically, at the extent of the frame member 40 that is not conjoined to the system case 10 by means of the said flexible component 30 wing element 32; one or more slots 51 are perpendicularly disposed on the said electronic junction board 50, with the said slots 51 capable of accommodating the insertion of a printed circuit board 60 and various interface cards; the said printed circuit board 60 and interface cards are in a state of electrical continuity with and physically connected to the said electronic junction board 50; and the ports 41 installed on the frame member 40 are interconnected with the printed circuit board 60 and interface cards on the electronic junction board 50 via circuitry or other means.

Figure 5:
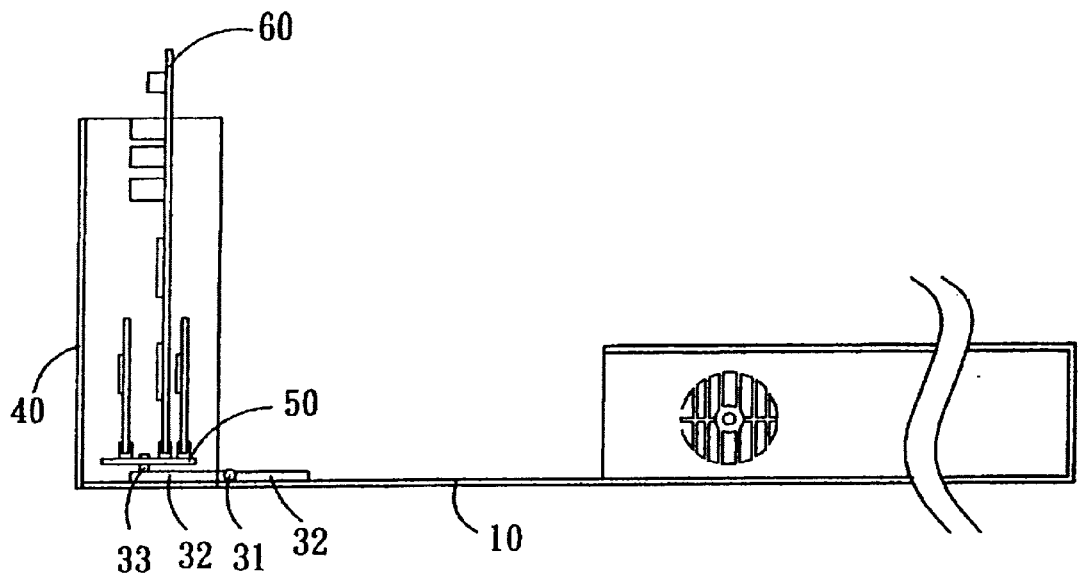
FIG. 5 is an orthographic drawing of the invention herein, with the flexible component turned outward.
Figure 6:
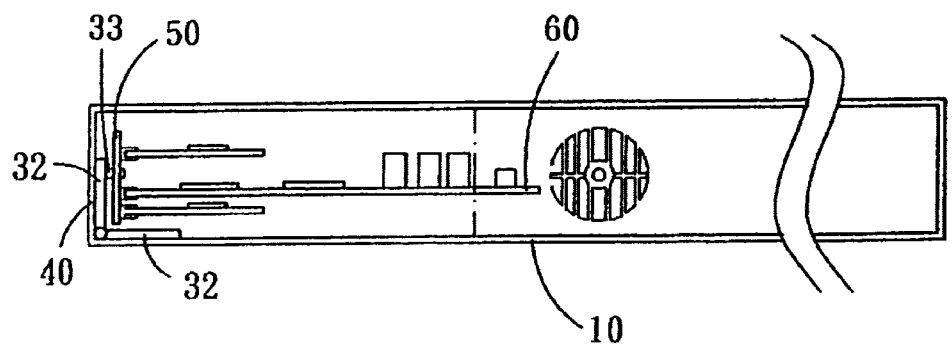
FIG. 6 is an orthographic drawing of the invention herein, with the flexible component turn inward.

During utilization, referring to FIG. 4, FIG. 5, and FIG. 6, the frame member 40 movably linked to the flexible component 30 is first turned outward such that the two wing elements 32 of the flexible component 30 are in a linear state and, at the same time, parallel to the bottom surface of the system case 10 such that slots 51 on the electronic junction board 50 face upward to enable the integrator to easily insert the printed circuit board 60 and its interface cards into the slots 51 (as shown in FIG. 5), following which the frame member 40 is turned towards the system case 10 such that the frame member 40 is postured against the system case 10, with the peripheral ends of the frame member 40 and the system case 10 brought into confluence, resulting in the union of the frame member 40 and the system case 10 that enables the printed circuit board 60 to be moved along with the transition mount 33 within the system case 10 and, furthermore, the printed circuit board 60 to extend in a parallel orientation, with the printed circuit board 60 no longer projecting out of the system case 10 (as shown in FIG. 6); conversely, during disassembly, it is only necessary to turn the flexible component 30 outward such that the slots 51 on the transition mount 33 face upward to enable the integrator to easily remove the printed circuit board 60 for maintenance and replacement.

In summation of the foregoing section, since the physical structure and arrangement of the invention herein is original and, furthermore, improves upon the shortcomings of the conventional technology and provides for additional functionality, the present invention is consummately innovative and meets new patent application requirements.

I claim:

1. A structure of an industrial computer comprising:
   a) a system case having at least one power supply and an open end;
   b) an electronic junction board having at least one slot on a first surface thereof;
   c) a flexible component pivotally connecting the electronic junction board to an edge of the open end of the system case opposite the power supply; and
   d) at least one printed circuit board removably inserted into one of the at least one slot in the electronic junction board and electrically connected to the electronic junction board,
   wherein the electronic junction board is movable between a first position and a second position, in the first position the at least one slot extends upwardly from the first surface such that the at least one slot is positioned for insertion and removal of the at least one printed circuit board, and in the second position the at least one printed circuit board is positioned parallel with the open end of the case system and located within the case system.

2. The structure of an industrial computer according to claim 1, wherein the a flexible component has a transition mount connecting the electronic junction board to the flexible component.

3. The structure of an industrial computer according to claim 1, further comprising a frame member connected to the flexible component and having a plurality of ports for peripheral equipment, wherein the frame member is pivotally connected to the system case.

4. The structure of an industrial computer according to claim 1, further comprising a separator plate located in the system case between the power supply and the open end.

5. The structure of an industrial computer according to claim 1, wherein the flexible component includes a pivot pin and two interleaved wing elements pivotally connected by inserting the pivot pin therebetween.

6. A structure of an industrial computer comprising:
   a) a system case having at least one power supply and an open end,
   b) an electronic junction board having at least one slot on a first surface thereof;
   c) a flexible component having a transition mount and pivotally connecting the electronic junction board to an edge of the open end of the system case opposite the power supply, the transition mount connecting the electronic junction board to the flexible component; and
   d) at least one printed circuit board removably inserted into one of the at least one slot in the electronic junction board and electrically connected to the electronic junction board,
   wherein the electronic junction board is movable between a first position and a second position, in the first position the at least one slot extends upwardly from the first surface such that the at least one slot is positioned for insertion and removal of the at least one printed circuit board, and in the second position the at least one printed circuit board is positioned parallel with the open end of the case system and located within the case system, and
   wherein the flexible component includes a pivot pin and two interleaved wing elements pivotally connected by inserting the pivot pin therebetween.

* * * * *